(12) United States Patent
Lee

(10) Patent No.: US 12,707,563 B2
(45) Date of Patent: Aug. 11, 2026

(54) CIRCUIT BOARD

(71) Applicant: LG INNOTEK CO., LTD., Seoul (KR)

(72) Inventor: Sang Myung Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 274 days.

(21) Appl. No.: 18/267,891

(22) PCT Filed: Dec. 16, 2021

(86) PCT No.: PCT/KR2021/019209
§ 371 (c)(1),
(2) Date: Jun. 16, 2023

(87) PCT Pub. No.: WO2022/131826
PCT Pub. Date: Jun. 23, 2022

(65) Prior Publication Data

US 2024/0057253 A1 Feb. 15, 2024

(30) Foreign Application Priority Data

Dec. 16, 2020 (KR) ........................ 10-2020-0176544

(51) Int. Cl.
*H05K 1/03* (2006.01)
*H05K 1/02* (2006.01)
(Continued)

(52) U.S. Cl.
CPC ......... *H05K 1/0373* (2013.01); *H05K 1/0271* (2013.01); *H05K 1/116* (2013.01);
(Continued)

(58) Field of Classification Search
CPC .... H05K 1/0271; H05K 1/0373; H05K 1/116; H05K 2201/0209; H05K 2201/0254;
(Continued)

(56) References Cited

U.S. PATENT DOCUMENTS 3,193,789 A * 7/1965 Brown ................ H05K 3/4617 29/853
3,243,498 A * 3/1966 Allen ..................... H05K 1/115 439/83
(Continued)

FOREIGN PATENT DOCUMENTS

JP 11-214850 A 8/1999
JP 2010-129997 A 6/2010
(Continued)

*Primary Examiner* — Timothy J Thompson
*Assistant Examiner* — Rhadames Alonzo Miller
(74) *Attorney, Agent, or Firm* — Birch, Stewart, Kolasch & Birch, LLP

(57) ABSTRACT

A circuit board according to an embodiment includes an insulating layer including a cavity; and a metal layer disposed on an inner wall of the cavity of the insulating layer, wherein at least one recess concave toward the inside of the insulating layer is formed on an inner wall of the cavity, wherein the metal layer includes: a first metal layer disposed on the inner wall of the cavity while filling the recess; and a second metal layer disposed on the first metal layer and disposed on the inner wall of the cavity.

10 Claims, 8 Drawing Sheets

(51) Int. Cl.
*H05K 1/11* (2006.01)
*H05K 3/10* (2006.01)
*H05K 3/18* (2006.01)

(52) U.S. Cl.
CPC ............. *H05K 3/107* (2013.01); *H05K 3/188* (2013.01); *H05K 2203/095* (2013.01)

(58) Field of Classification Search
CPC .. H05K 2203/095; H05K 3/107; H05K 3/188; H05K 3/4682
See application file for complete search history.

(56) References Cited

U.S. PATENT DOCUMENTS

| | | | | | |
|---|---|---|---|---|---|
| 3,568,000 | A * | 3/1971 | D'Aboville | H05K 1/024 | 361/794 |
| 4,494,083 | A * | 1/1985 | Josefsson | H01P 5/08 | 333/33 |
| 4,598,470 | A * | 7/1986 | Dougherty, Jr. | H05K 3/32 | 174/262 |
| 4,668,332 | A * | 5/1987 | Ohnuki | H05K 3/4641 | 216/48 |
| 4,787,853 | A * | 11/1988 | Igarashi | H05K 3/3421 | 439/55 |
| 4,859,806 | A * | 8/1989 | Smith | H01R 12/523 | 439/46 |
| 4,906,198 | A * | 3/1990 | Cosimano | H05K 1/115 | 439/85 |
| 4,949,163 | A * | 8/1990 | Sudo | H01L 24/48 | 257/784 |
| 5,038,252 | A * | 8/1991 | Johnson | H05K 3/4641 | 439/82 |
| 5,118,300 | A * | 6/1992 | Zarreii | H05K 7/1458 | 439/74 |
| 5,266,912 | A * | 11/1993 | Kledzik | H05K 7/023 | 257/664 |
| 5,399,104 | A * | 3/1995 | Middlehurst | H01R 13/6599 | 439/607.14 |
| 5,487,218 | A * | 1/1996 | Bhatt | H05K 1/112 | 174/262 |
| 5,568,107 | A * | 10/1996 | Buuck | H05K 1/0253 | 333/246 |
| 5,689,216 | A * | 11/1997 | Sturdivant | H01P 5/08 | 333/260 |
| 5,718,606 | A * | 2/1998 | Rigby | H01R 12/7035 | 439/607.1 |
| 5,961,349 | A * | 10/1999 | Paagman | H05K 1/112 | 439/63 |
| 6,137,064 | A * | 10/2000 | Kiani | H05K 1/0222 | 174/262 |
| 6,181,219 | B1 * | 1/2001 | Gailus | H05K 1/024 | 174/262 |
| 6,388,208 | B1 * | 5/2002 | Kiani | H05K 1/0222 | 174/266 |
| 6,392,160 | B1 * | 5/2002 | Andry | H05K 1/0222 | 439/63 |
| 6,541,712 | B1 * | 4/2003 | Gately | H05K 3/429 | 174/262 |
| 6,593,535 | B2 * | 7/2003 | Gailus | H01R 12/523 | 174/262 |
| 6,603,079 | B2 * | 8/2003 | Biron | H05K 3/4092 | 174/262 |
| 8,191,249 | B2 | 6/2012 | Park | | |
| 2001/0029066 | A1 * | 10/2001 | Itagaki | H05K 3/007 | 257/E21.503 |
| 2002/0011348 | A1 * | 1/2002 | Takeuchi | H05K 1/0265 | 174/254 |
| 2004/0115968 | A1 * | 6/2004 | Cohen | H01R 13/6587 | 439/79 |
| 2004/0212972 | A1 * | 10/2004 | Khilchenko | H05K 3/321 | 174/262 |
| 2005/0029013 | A1 * | 2/2005 | Lee | H05K 1/0251 | 174/262 |
| 2005/0155222 | A1 * | 7/2005 | Nakamura | H05K 3/0058 | 29/830 |
| 2007/0082183 | A1 | 4/2007 | Murai et al. | | |
| 2008/0264684 | A1 * | 10/2008 | Kang | H05K 3/428 | 174/250 |
| 2011/0139494 | A1 | 6/2011 | Yu et al. | | |
| 2012/0073865 | A1 * | 3/2012 | Kang | H05K 3/428 | 174/250 |
| 2012/0217043 | A1 | 8/2012 | Park | | |
| 2013/0277097 | A1 | 10/2013 | Maeng | | |
| 2015/0034366 | A1 * | 2/2015 | Yoshioka | H05K 3/0079 | 174/251 |
| 2020/0205284 | A1 | 6/2020 | Shin | | |

FOREIGN PATENT DOCUMENTS

| | | | | |
|---|---|---|---|---|
| JP | 2011-100797 | A | 5/2011 | |
| JP | 2013-168613 | A | 8/2013 | |
| JP | 2016-92307 | A | 5/2016 | |
| JP | 2021-19061 | A | 2/2021 | |
| KR | 10-2008-0096985 | A | 11/2008 | |
| KR | 10-2012-0023894 | A | 3/2012 | |
| KR | 20120023894 | A * | 3/2012 | H05K 1/0373 |
| KR | 10-2012-0074113 | A | 7/2012 | |
| KR | 10-2019-0012873 | A | 2/2019 | |

* cited by examiner

【FIG. 1】
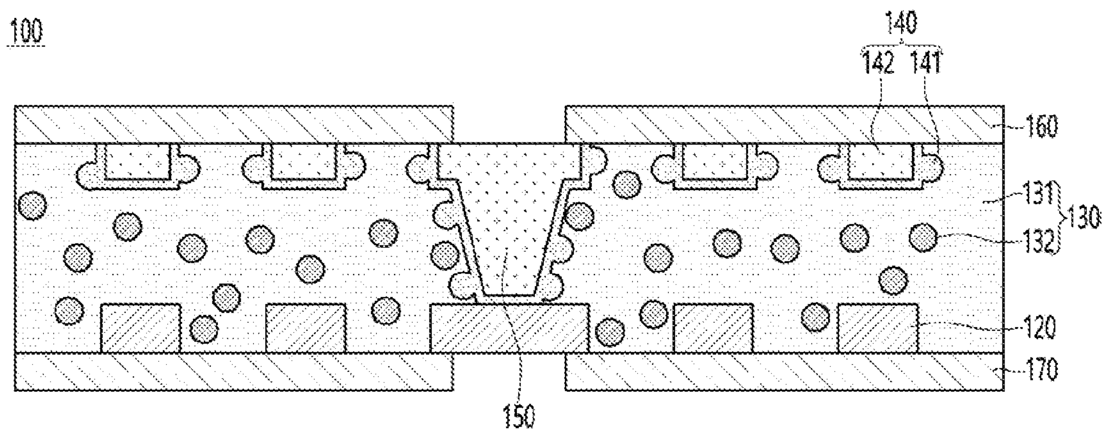
【FIG. 2】
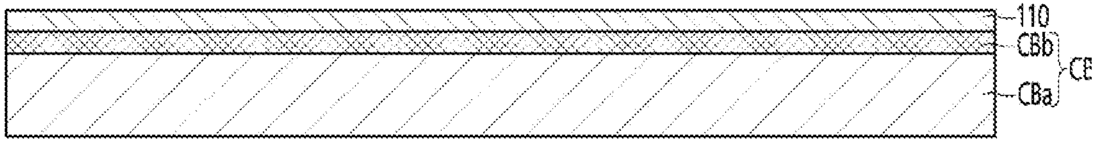
【FIG. 3】
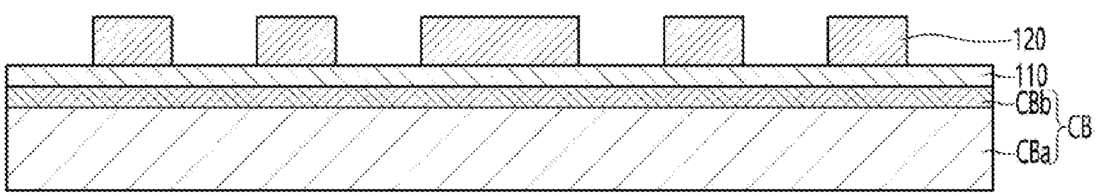

【FIG. 4】
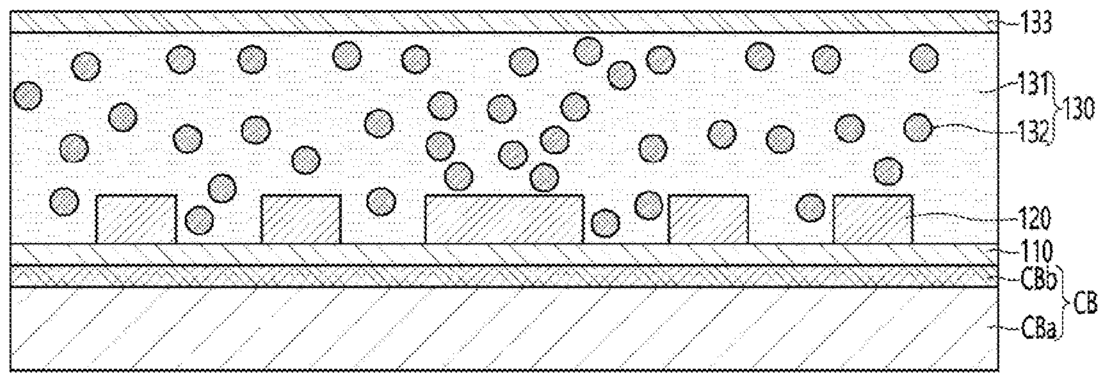
【FIG. 5】
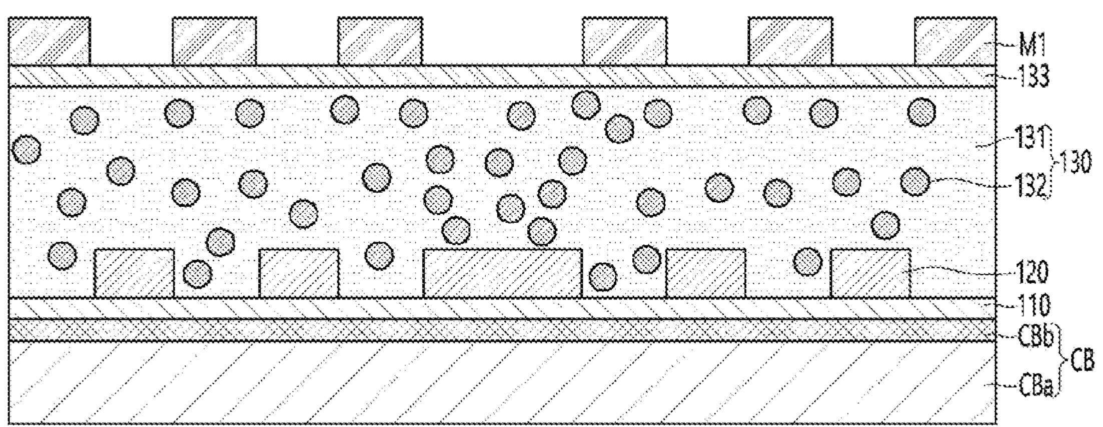

【FIG. 6】
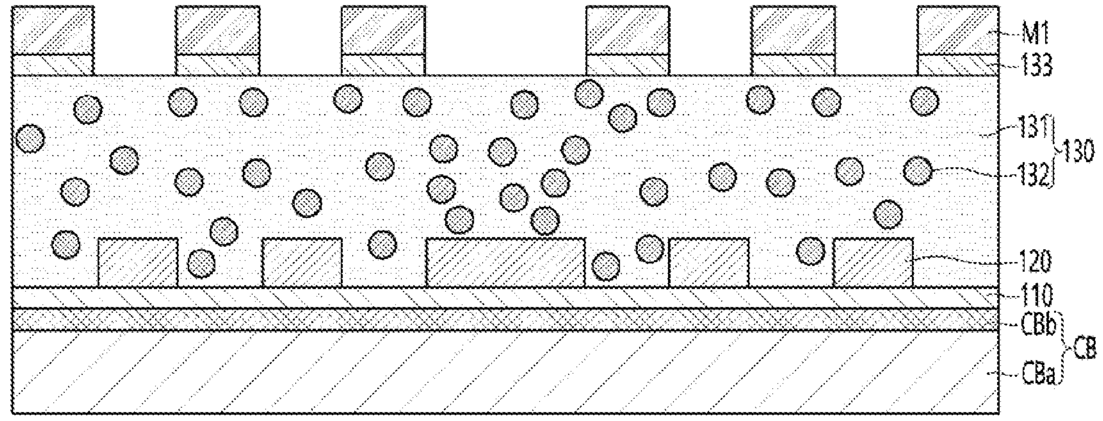
【FIG. 7】
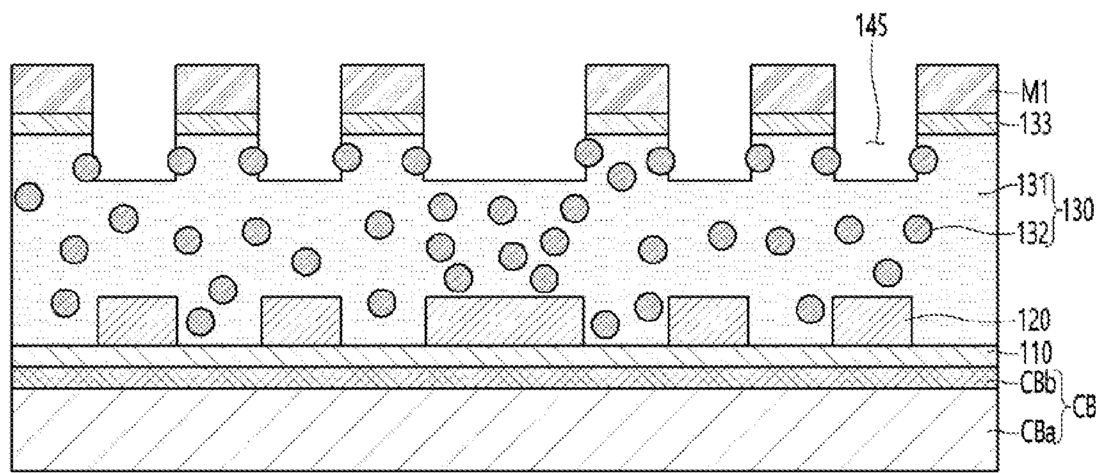

【FIG. 8】
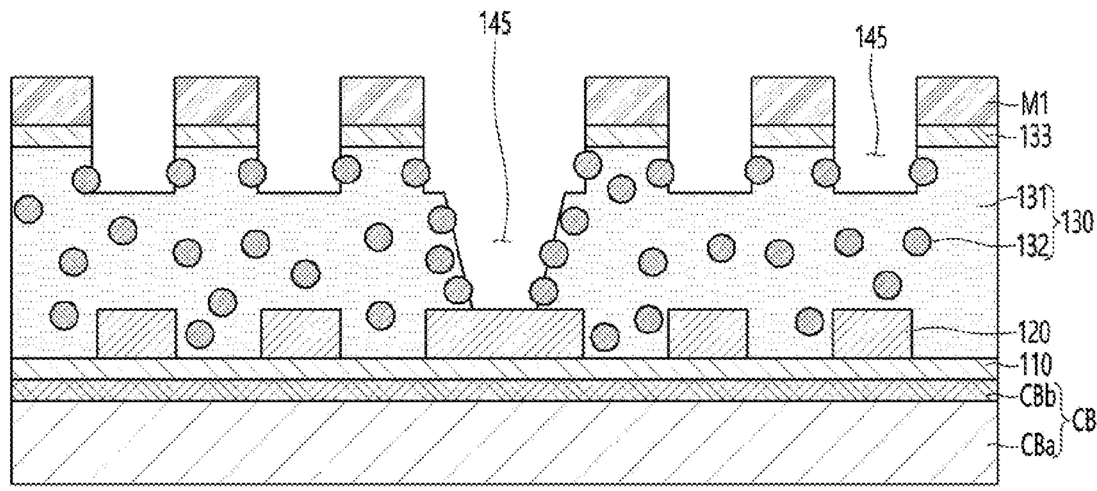
【FIG. 9】
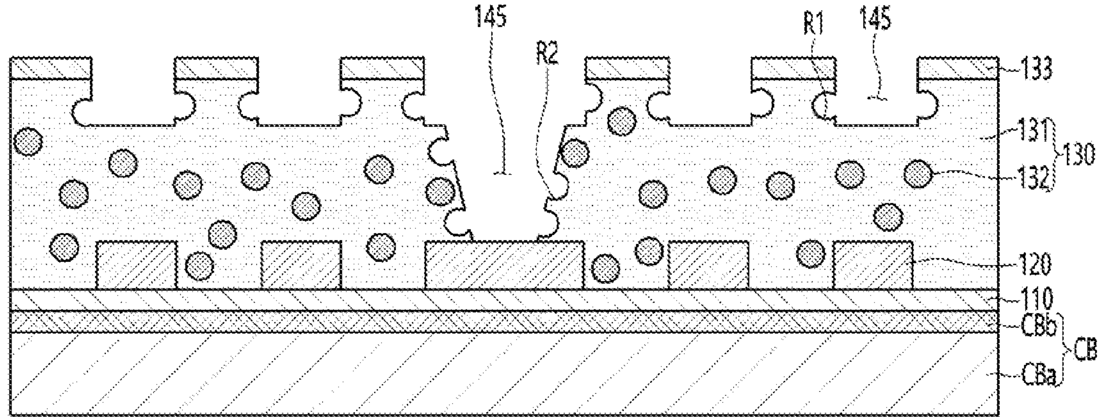

【FIG. 10】
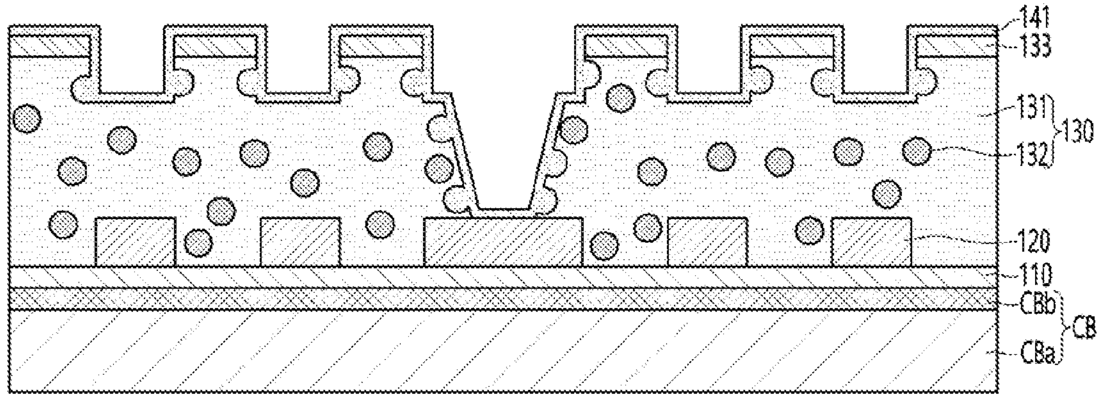
【FIG. 11】
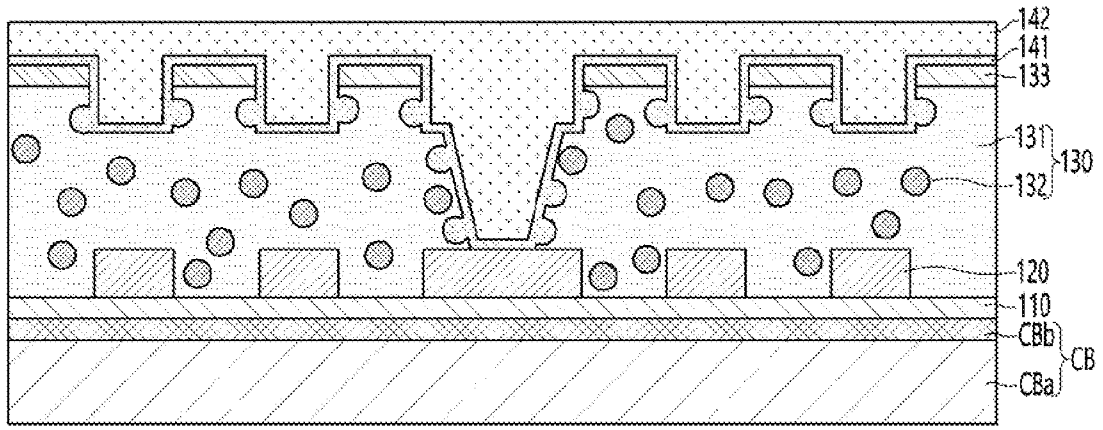

【FIG. 12】
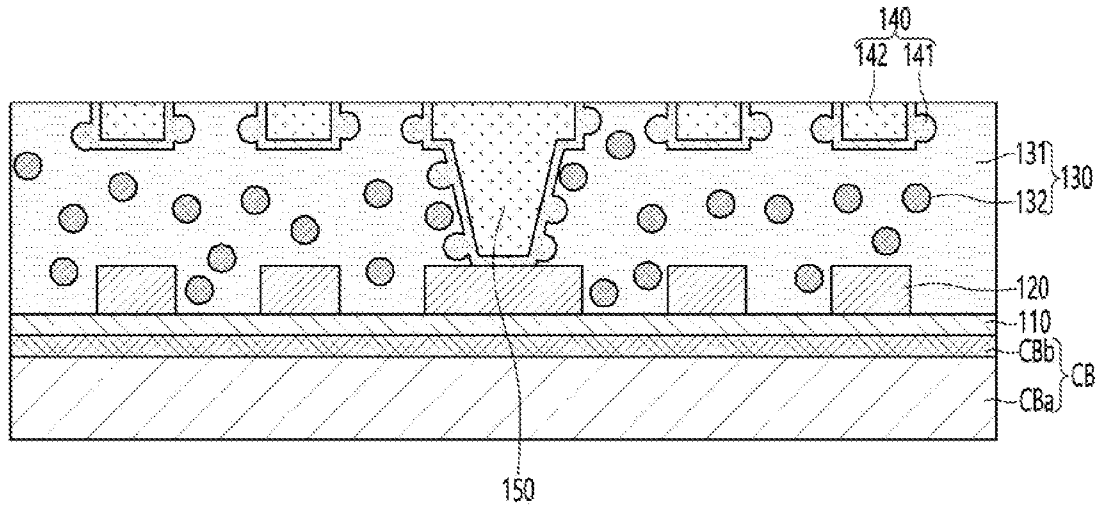
【FIG. 13】
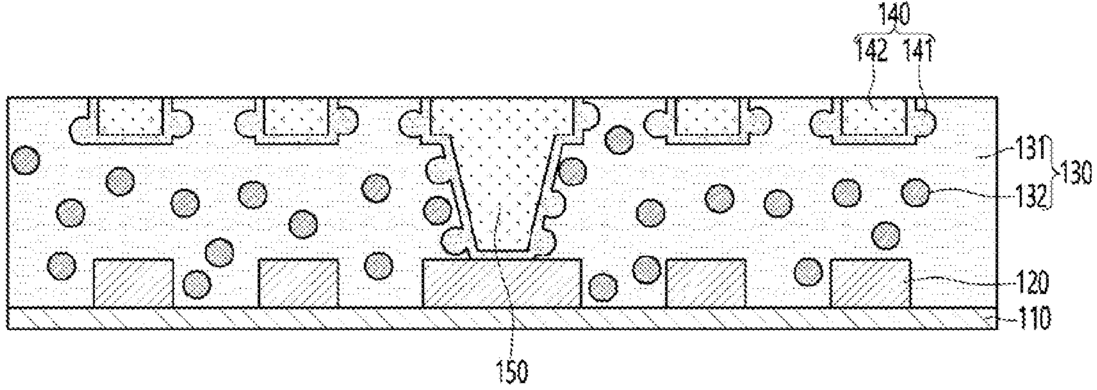

【FIG. 14】
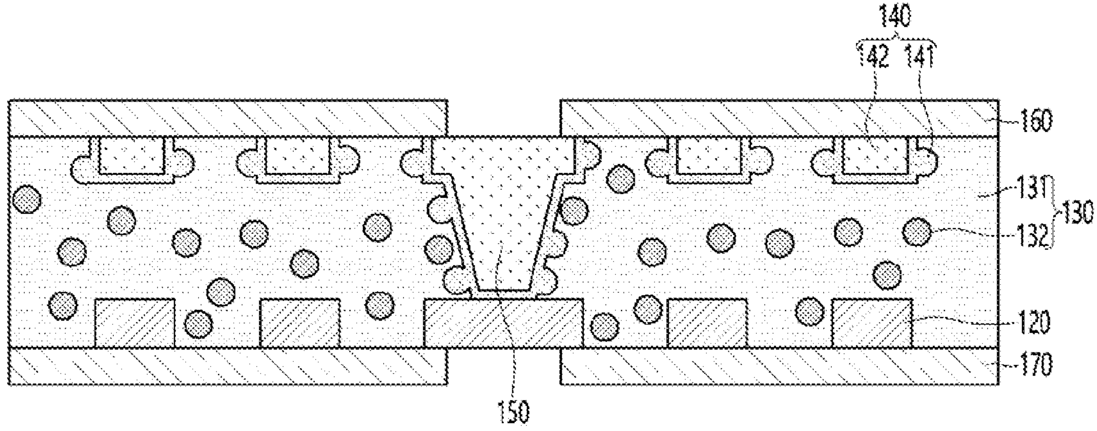
【FIG. 15】
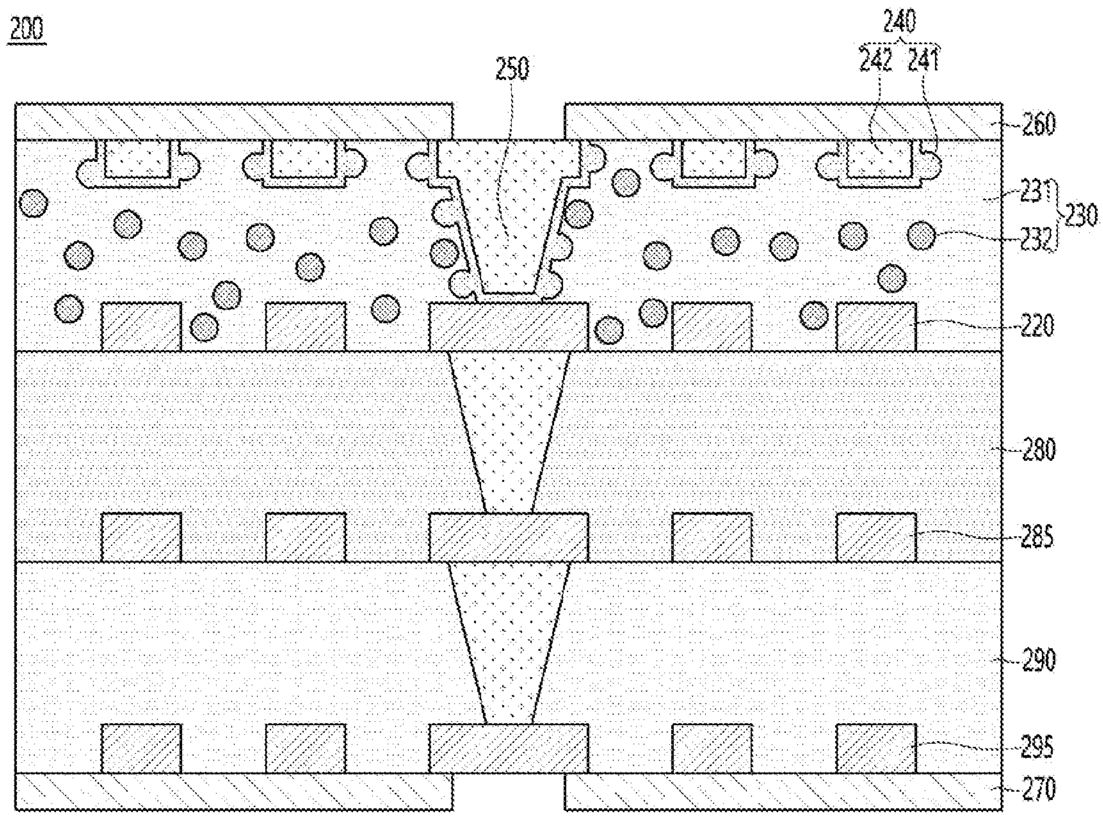

【FIG. 16】
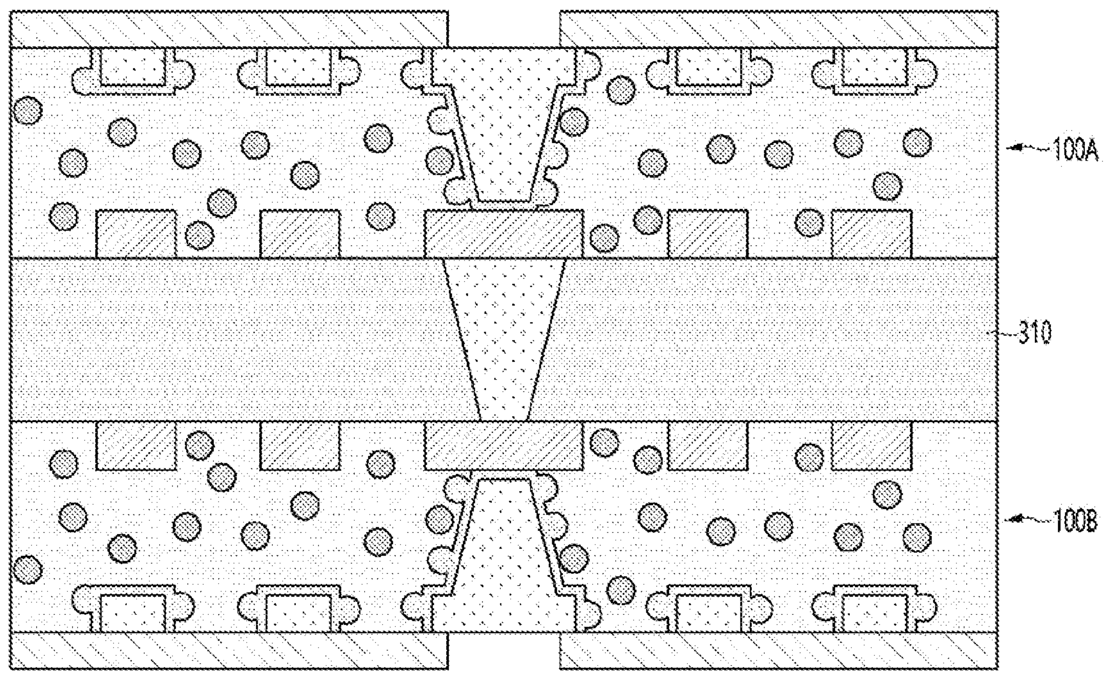
【FIG. 17】
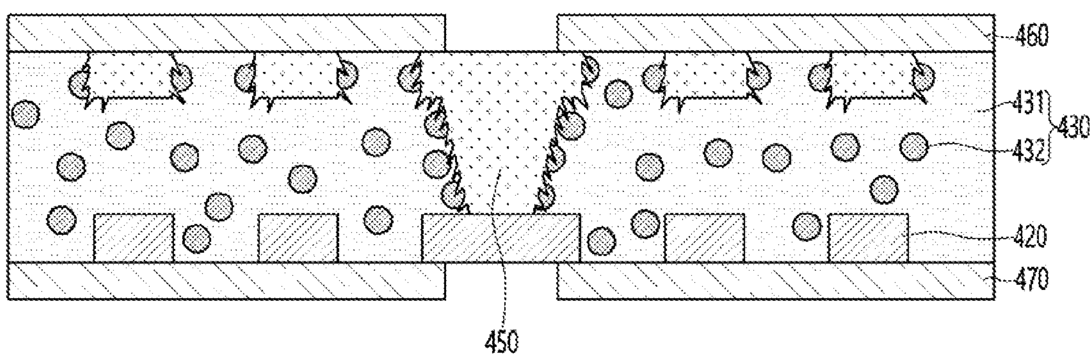

CIRCUIT BOARD

CROSS REFERENCE TO RELATED APPLICATIONS

This application is the National Phase of PCT International Application No. PCT/KR2021/019209, filed on Dec. 16, 2021, which claims priority under 35 U.S.C. 119(a) to Patent Application No. 10-2020-0176544, filed in the Republic of Korea on Dec. 16, 2020, all of which are hereby expressly incorporated by reference into the present application.

BACKGROUND

Technical Field

The embodiment relates to a circuit board.

Discussion of the Related Art

A line width of a circuit is being miniaturized as miniaturization, weight reduction, and integration of an electronic component are accelerated. In particular, as a design rule of a semiconductor chip is integrated on a nanometer scale, a circuit line width of a package substrate or a printed circuit board on which the semiconductor chip is mounted has been made fine to several micrometers or less.

Various methods have been proposed in order to increase the degree of circuit integration of the printed circuit board, that is, to reduce the circuit line width. For the purpose of preventing loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for making the circuit pitch fine.

Meanwhile, recently, in order to meet a demand for wireless data traffic, efforts have been made to develop an improved 5G (5th generation) communication system or a pre-5G communication system. Here, the 5G communication system uses ultra-high frequency (mmWave) bands (sub 6 GHz, 28 GHz, 38 GHz, or higher frequencies) to achieve high data transfer rates.

In addition, in order to reduce a path loss of radio waves and increase a transmission distance of radio waves in the ultra-high frequency band, in the 5G communication system, integration technologies such as beamforming, massive multi-input multi-output (massive MIMO), and array antennas have been developed. Considering that it may be composed of hundreds of active antennas of wavelengths in the frequency bands, an antenna system becomes large relatively.

Since such an antenna and AP module are patterned or mounted on the printed circuit board, low loss on the printed circuit board is very important. This means that several substrates constituting the active antenna system, that is, an antenna substrate, an antenna power feeding substrate, a transceiver substrate, and a baseband substrate, should be integrated into one compact unit.

In addition, the circuit board applied to the 5G communication system as described above is manufactured in a trend of light, thin and compact, and accordingly, the circuit pattern is becoming gradually finer.

Accordingly, in order to protect the miniaturized circuit pattern, a circuit board having a structure in which the circuit pattern is buried in an insulating layer is being developed.

However, in the case of a general embedded trace substrate (ETS), only one outermost circuit pattern among outermost circuit patterns has a structure that is embedded in the insulating layer, and thus has an asymmetrical structure, thereby reducing warpage property. In addition, in the case of the embedded trace substrate as described above, there is a limit to the formation of fine circuit patterns having a line width of 10 μm or less and an interval of 10 μm or less due to the characteristics of the method.

Meanwhile, in the case of a circuit board including a conventional double-sided buried circuit pattern, a recess is formed by trenching an insulating layer, and plating is performed in the recess to form a buried circuit pattern. However, in the case of a circuit board including a conventional double-sided embedded circuit pattern as described above, there is a limit to trenching by processing prepreg containing glass fibers, and accordingly, there is a problem that can be applied only to materials such as RCC or ABF. In addition, as described above, fillers are included in an insulating layer such as RCC or ABF, and signal transmission loss of circuit patterns due to the fillers increases.

SUMMARY

The embodiment provides a circuit board with a new structure and a method for manufacturing the same.

In addition, the embodiment provides a circuit board having a structure in which circuit patterns of outermost layers are all buried in an insulating layer and a method for manufacturing the same.

In addition, the embodiment provides a circuit board in which the circuit pattern of the outermost layer has a symmetrical structure with respect to the insulating layer and a method for manufacturing the same.

In addition, the embodiment provides a circuit board capable of improving adhesion to a metal layer by implementing surface roughness of a certain level or more on an inner wall of a pattern groove or through hole formed in an insulating layer, and a method for manufacturing the circuit board.

Technical problems to be solved by the proposed embodiments are not limited to the above-mentioned technical problems, and other technical problems not mentioned may be clearly understood by those skilled in the art to which the embodiments proposed from the following descriptions belong.

A circuit board according to an embodiment comprises an insulating layer including a cavity; and a metal layer disposed on an inner wall of the cavity of the insulating layer, wherein at least one recess concave toward the inside of the insulating layer is formed on an inner wall of the cavity, wherein the metal layer includes: a first metal layer disposed on the inner wall of the cavity while filling the recess; and a second metal layer disposed on the first metal layer and disposed on the inner wall of the cavity.

In addition, the cavity includes a first cavity disposed adjacent to an upper surface of the insulating layer; and a second cavity disposed adjacent to a lower surface of the insulating layer.

In addition, the first cavity and the second cavity have a step and overlap in a vertical direction.

In addition, the first and second metal layers disposed in the first cavity are a first circuit pattern.

In addition, the circuit board further comprises a second circuit pattern disposed on the lower surface of the insulating layer, and wherein the first and second metal layers disposed in the second cavity are a through electrode connecting between the first circuit pattern and the second circuit pattern.

In addition, the insulating layer includes a resin and a filler disposed in the resin, and wherein the recess corresponds to a shape of the filler.

In addition, a width of the recess in a horizontal direction corresponds to a diameter of the filler.

In addition, the width of the recess in the horizontal direction has a range of 0.5 μm to 1.0 μm.

In addition, an area occupied by the recess in a total area of the inner wall of the cavity satisfies a range of 3% to 10% of the total area of the inner wall of the cavity.

In addition, the insulating layer includes any one of RCC (Resin coated copper), ABF (Ajinomoto build up film) and PID (Photo Imageable Dielectric).

Advantageous Effects

The circuit board of the embodiment may have a structure in which all circuit patterns of an outermost layer disposed on both sides of an insulating layer are all buried in the insulating layer. According to this, as the embodiment has a structure in which all of the circuit patterns are buried in the insulating layer, it is possible to reduce a thickness of the printed circuit board by a thickness of the circuit pattern, thereby achieving a slimmer product.

In addition, when only one circuit pattern of both sides of the circuit board is buried in the insulating layer, there is a problem in that warpage occurs due to an asymmetric structure during the manufacturing process of the circuit board. On the other hand, in the embodiment, the occurrence of warpage of the circuit board can be minimized by embedding the circuit patterns on both sides of the circuit board in the insulating layer, and thus product reliability can be improved.

In addition, a pattern groove is formed on at least one surface of the insulating layer of the embodiment. And, at least one first recess is formed in the pattern groove. That is, the insulating layer may include a filler, and at least a portion of the filler may be exposed through the pattern groove. In this case, the embodiment proceeds with a process of removing the filler exposed through the pattern groove. Accordingly, the first recess corresponding to a position where the filler escapes is formed on an inner wall of the pattern groove. Accordingly, the second circuit pattern formed while filling the pattern groove may be formed while filling the first recess of the pattern groove. Accordingly, the circuit board according to the embodiment can solve the reliability problem of the second circuit pattern caused by exposure of the filler through the pattern groove. In addition, the embodiment may improve bonding strength between the insulating layer and the second circuit pattern by implementing a surface roughness (Ra) corresponding to the first recess on the inner wall of the pattern groove, and accordingly, product reliability can be improved.

BRIEF DESCRIPTION OF THE DRAWINGS

FIG. 1 is a view illustrating a circuit board according to a first embodiment.

FIGS. 2 to 14 are views illustrating a manufacturing method of the circuit board shown in FIG. 1 in order of processes.

FIG. 15 is a view illustrating a circuit board according to a second embodiment.

FIG. 16 is a view illustrating a circuit board according to a third embodiment.

FIG. 17 is a view illustrating a circuit board according to a fourth embodiment.

DETAILED DESCRIPTION OF THE EMBODIMENTS

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (a), and (b) may be used.

These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements.

Further, when expressed as "on (over)" or "under (below) ", it may include not only the upper direction but also the lower direction based on one element.

—Electronic Device—

Before describing the embodiment, an electronic device including the semiconductor package of the embodiment will be briefly described. A semiconductor package according to an embodiment may include a chip mounted on a circuit board of a circuit board described below:

The electronic device includes a main board (not shown). The main board may be physically and/or electrically connected to various components. For example, the main board may be connected to the semiconductor package of the embodiment. Various chips may be mounted on the semiconductor package. Broadly, memory chips such as volatile memory (e.g., DRAM), non-volatile memory (e.g., ROM), flash memory, and the like, an application processor chip such as a central processor (e.g., CPU), a graphics processor (e.g. GPU), a digital signal processor, an encryption processor, a microprocessor, and a microcontroller, and a logic chip such as an analog-to-digital converter or an application-specific IC (ASIC) may be mounted on the semiconductor package.

Further, the embodiment provides a semiconductor package capable of mounting at least two different types of chips on one substrate while reducing the thickness of the semiconductor package connected to the main board of the electronic device.

In this case, the electronic device may be a smart phone, a personal digital assistant, a digital video camera, a digital still camera, a network system, computer, a monitor, a tablet, a laptop, a netbook, a television, a video game, a smart watch, an automotive, or the like. However, the embodiment is not limited thereto, and in addition to these, any other electronic device for processing data may be included.

Embodiments

FIG. 1 is a view illustrating a circuit board according to a first embodiment.

Referring to FIG. 1, a circuit board 100 according to an embodiment includes an insulating layer 130, a first circuit pattern 120, a second circuit pattern 140, a through electrode 150, and a first protective layer 160, and a second protective layer 170.

The circuit board in the embodiment may have a low dielectric constant. To this end, the circuit board may be formed of resin coated copper (RCC) having a low dielectric constant. The resin coated copper may include an insulating layer and a copper foil layer formed on at least one surface of the insulating layer.

In addition, the circuit board in the embodiment may include an insulating layer 130 corresponding to the resin coated copper, and a first circuit pattern 120 and a second circuit pattern 140 having a structure buried on both sides of the insulating layer 130.

The insulating layer 130 may have a low dielectric constant. For example, the insulating layer 130 may have a dielectric constant of 2.8 Dk or less. For example, the insulating layer 130 may have a dielectric constant of 2.5 Dk or less.

To this end, the resin 131 constituting the insulating layer 130 uses a modified epoxy or maleimide series to lower the dielectric constant of the insulating layer 130.

The dielectric constant of the insulating layer 130 may be determined by a combination of dielectric constants of the resin 131 and the filler 132 dispersed in the resin.

That is, the resin 131 in the embodiment may include a modified epoxy having a Dk of 2.3 Dk to 2.5 Dk or a maleimide-based resin.

In addition, the filler 132 may include a ceramic material of any one of $SiO_2$, $ZrO_3$, $HfO_2$, and $TiO_2$, and may have a dielectric constant ranging from 3.7 to 4.2 Dk.

In this case, the dielectric constant of the insulating layer 130 can be adjusted by the dielectric constant of the resin 131, the dielectric constant of the filler 132, and the content of the filler 132 in the insulating layer 130. However, it is difficult to adjust the dielectric constant of the insulating layer 130 to a level of 2.5 Dk only by adjusting it.

Accordingly, the filler 132 in the embodiment may be a porous filler or a hollow filler. The porous filler has a structure in which non-penetrating grooves are formed on the surface of the filler 132. In addition, the hollow filler has a structure in which through-holes are formed on the surface of the filler 132.

In addition, the filler 132 may have a range between 10 vol. % and 40 vol. % within a total volume of the insulating layer 130. Correspondingly, in the insulating layer 130, the resin 131 has 60 vol. % to 90 vol. %.

In addition, a porosity, which is a ratio of the volume of pores such as holes or grooves formed in the filler to a total volume of the filler 132, may be 20% to 35%. When the porosity of the filler 132 is less than 20%, it is difficult to adjust the dielectric constant of the insulating layer 130 to 2.5 Dk or less. In addition, when the porosity of the filler 132 is greater than 35%, a strong property of the filler 132 is weakened and cracks may occur in various environments.

Meanwhile, the insulating layer 130 in the embodiment may include ABF (Ajinomoto build up film) or PID (Photo Imageable Dielectric) in addition to RCC.

The insulating layer 130 may include a material that can be processed through processes such as exposure and development.

The insulating layer 130 may include a cavity. The cavity may be a space in which a circuit pattern described below is disposed. The cavity may be a space in which a through electrode described below is disposed. For example, the cavity may mean a pattern groove in which a circuit pattern is disposed. For example, the cavity may mean a through hole in which a through electrode is disposed. The pattern groove in which the circuit pattern is disposed may also be referred to as a first cavity. In addition, the through hole in which the through electrode is disposed may also be referred to as a second cavity. In this case, the cavity and the through hole may be selectively connected. That is, the first cavity or the pattern groove disposed in a first region of the circuit board may not be connected to the second cavity or the through hole. For example, the first cavity or the pattern groove disposed in the first region of the circuit board may not vertically overlap the second cavity or the through hole. Also, the first cavity or the pattern groove disposed in a second region of the circuit board may be connected to the second cavity or the through hole. For example, the first cavity or the pattern groove disposed in the second region of the circuit board may vertically overlap the second cavity or the through hole.

In addition, the circuit board 100 of the embodiment may include a metal layer filling the cavity of the insulating layer 130. For example, the metal layer may mean a circuit pattern filling a cavity of the insulating layer 130. Alternatively, the metal layer may mean a through electrode filling the cavity of the insulating layer 130. For example, the circuit board 100 may include a metal layer disposed on an inner wall of the cavity of the insulating layer 130.

Hereinafter, for convenience of description, the cavity is referred to as a pattern groove and a through hole, respectively. In addition, a metal layer filling the pattern groove is referred to as a circuit pattern, and a metal layer filling the through hole is referred to as a through electrode. This will be explained in detail below.

Meanwhile, the circuit board 100 in the first embodiment may be manufactured through an embedded trace substrate (EST) method. Accordingly, the circuit pattern disposed on at least one surface of the insulating layer 130 may have a structure buried in the insulating layer 130. In this case, in the embodiment, a pattern groove (145, see FIG. 7) is formed on the insulating layer 130, and a plating process for filling the formed pattern groove 145 is performed. Accordingly, both the first circuit pattern 120 and the second circuit pattern 140 in the embodiment may have a structure buried in the insulating layer 130.

The first circuit pattern 120 and the second circuit pattern 140 may have different shapes or structures.

The first circuit pattern 120 may not include a seed layer. For example, the first circuit pattern 120 may have a one-layer structure. However, embodiments are not limited thereto. For example, when the first circuit pattern 120 includes a surface treatment layer, the first circuit pattern 120 may include a plurality of layers. However, when the circuit board 100 is manufactured by a general ETS method, the first circuit pattern 120 may have a one-layer structure, and at least three surfaces may be covered by the insulating layer 130.

Meanwhile, the second circuit pattern 140 is formed to fill the pattern groove 145 formed on the upper surface of the insulating layer 130. In this case, in a process of forming the pattern groove 145, a portion of the filler 132 disposed in the insulating layer 130 may be exposed through the pattern groove 145. In addition, when the filler 132 is exposed through the pattern groove 145, a size of the pattern groove 145 may be reduced by the exposed filler 132. Accordingly, it may affect signal transmission performance through the second circuit pattern 140. For example, when the filler 132 is exposed through the pattern groove 145, signal transmission loss of the second circuit pattern 140 may increase due to the exposed filler 132.

Furthermore, the insulating layer 130 may have low surface roughness as it has a low dielectric constant. For example, the insulating layer 130 may have a surface roughness (Ra) in a range of 0.05 μm to 0.11 μm. Accordingly, when a first metal layer 141 of the second circuit pattern 140 is formed on the inner wall of the pattern groove 145, peel strength between the first metal layer 141 and the insulating layer 130 may be reduced due to the low surface roughness (Ra) of the insulating layer 130. Accordingly, in the embodiment, in order to solve the above problem, the inner wall of the pattern groove 145 of the insulating layer 130 can be implemented with a surface roughness Ra of a certain level or higher.

For example, in the embodiment, a pattern groove 145 is formed on a surface of the insulating layer 130, and the second circuit pattern 140 is formed by filling the formed pattern groove 145. In this case, when the filler 132 is exposed through the pattern groove 145, a problem may occur in the reliability of the second circuit pattern 140 by the filler 132. Therefore, the embodiment allows removing the filler 132 protruding through the inner wall of the pattern groove 145. That is, the embodiment removes the filler 132 exposed through the inner wall of the pattern groove 145 to implement a surface roughness Ra of a certain level or higher on the inner wall of the pattern groove 145.

Specifically, the embodiment may proceed with a process of removing the filler 132 exposed through the pattern groove 145 after the pattern groove 145 is formed. Accordingly, when the filler 132 is removed, a first recess R1 (see FIG. 9) corresponding to a space where the filler 132 escapes may be formed on the inner wall of the pattern groove 145.

Accordingly, the inner wall of the pattern groove 145 in the embodiment has a surface roughness Ra corresponding to a depth of the first recess R1. Specifically, the surface roughness Ra of the pattern groove 145 may also be referred to as the depth of the first recess R1. Here, the depth of the first recess R1 may mean a width of the first recess R1 in a horizontal direction. The surface roughness (Ra) of the inner wall of the pattern groove 145 in the first embodiment below is the depth of the first recess R1, and accordingly, the surface roughness Ra of the inner wall of the pattern groove 145 will be described as "the depth of the first recess R1".

In this case, in the embodiment, the depth of the first recess R1 formed in the pattern groove 145 is set to have a range between 0.5 μm and 1.0 μm. For example, when the depth of the first recess R1 formed on the inner wall of the pattern groove 145 is smaller than 0.5 μm, the peel strength between the insulating layer 130 and the first metal layer 141 is reduced, and accordingly, a reliability problem may occur. In addition, when the depth of the first recess R1 of the inner wall of the pattern groove 145 is greater than 1.0 μm, the surface roughness Ra of the first metal layer 141 increases correspondingly, and accordingly, transmission loss due to a skin effect of the second circuit pattern 140 may increase. Furthermore, a fact that the depth of the first recess R1 formed on the inner wall of the pattern groove 145 is greater than 1.0 μm means that there is a great amount of filler 132 exposed through the pattern groove 145. This means that the content of the filler 132 in the insulating layer 130 is high. For example, when the surface roughness (Ra) of the inner wall of the pattern groove 145 is greater than 1.0 μm, it means that the content of the filler 132 included in the insulating layer 130 is great, and accordingly, the insulating layer 130 may not have a low dielectric constant of 2.5 Dk or less. Accordingly, in the embodiment, the depth of the first recess R1 of the inner wall of the pattern groove 145 is in the range of 0.5 μm to 1.0 μm.

Meanwhile, the surface roughness Ra of the inner wall of the pattern groove 145 may be determined by a ratio of an area occupied by the first recess R1 to a total area of the inner wall of the pattern groove 145. In the embodiment, the first recess R1 occupies 3% to 10% of the total area of the inner wall of the pattern groove 145. That is, when the area occupied by the first recess R1 in the total area of the inner wall of the pattern groove 145 is less than 3%, this means that the content of the filler 132 included in the insulating layer 130 is lower than 20%, as a result, since the rigidity of the insulating layer 130 is weak, it may be difficult to manufacture a normal circuit board. In addition, when the area occupied by the first recess R1 in the total area of the inner wall of the pattern groove 145 is less than 3%, this means that the surface roughness (Ra) of the inner wall of the pattern groove 145 is smaller than 0.5 μm, and accordingly, a reliability problem may occur. In addition, when the area occupied by the first recess R1 in the total area of the inner wall of the pattern groove 145 is greater than 10%, this means that the content of the filler 132 included in the insulating layer 130 is greater than 80%, and accordingly, the insulating layer 130 may not have a low permittivity of 2.5 Dk or less. In addition, when the area occupied by the first recess R1 in the total area of the inner wall of the pattern groove 145 is greater than 10%, this means that the surface roughness (Ra) of the inner wall of the pattern groove 145 is greater than 1.0 μm, and thus a skin effect of the second circuit pattern 140 may occur.

Meanwhile, a plurality of first recesses R1 may be formed on an inner wall of the pattern groove 145. In this case, the first recess R1 may correspond to the shape and diameter of the filler 132. For example, the first recess R1 may have a width corresponding to the diameter of the filler 132. For example, the filler 132 may have a diameter ranging from 0.5 μm to 1.0 μm. Also, the depth of the first recess R1 formed on the inner wall of the pattern groove 145 may correspond to the diameter of the filler 132. In addition, when the depth of the first recess R1 is greater than 1.0 μm, the size of the pattern groove 145 may be excessively expanded during the removal of the filler exposed through the pattern groove 145. In this case, miniaturization of the second circuit pattern 140 formed while filling the pattern groove 145 may be difficult. Accordingly, the filler 132 in the embodiment may have a diameter in the range of 0.5 μm to 1.0 μm, and the first recess R1 may have a depth corresponding to the diameter of the filler 132.

As described above, the first embodiment implements a surface roughness (Ra) of a certain level or more corresponding to the first recess (R1) on the inner wall of the pattern groove (145) by removing the filler 132 exposed through the pattern groove 145, and accordingly, the bonding strength between the first metal layer 141 constituting the second circuit pattern 140 and the insulating layer 130 can be improved.

The first metal layer 141 may be composed of one layer, or may be composed of two or more layers. For example, the first metal layer 141 may be formed of a one-layer chemical copper plating layer. The chemical copper plating layer may be classified into a heavy copper plating layer (more than 2 μm), a medium copper plating layer (1~2 μm), and a light copper plating layer (1 μm or less) depending on the thickness. Also, in the embodiment, the first metal layer 141 is a medium copper plating layer or a light copper plating layer, and may satisfy a thickness of 0.5 to 1.5 μm.

In addition, the first metal layer 141 may be formed in two or more layers by a sputtering method. For example, the first metal layer 141 may include a nickel metal layer and a copper metal layer formed by a sputtering method. The nickel metal layer may have a thickness of 40 nm to 100 nm. In addition, the copper metal layer may be formed on the nickel metal layer to have a thickness of 100 nm to 200 nm.

Meanwhile, the second circuit pattern 140 includes a second metal layer 142. The second metal layer 142 may be formed while filling the inside of the pattern groove 145 using the first metal layer 141 as a seed layer.

As described above, the first circuit pattern 120 and the second circuit pattern 140 in the embodiment may have different shapes or different surface roughness Ra.

The first circuit pattern 120 is formed before the insulating layer 130 is stacked. Alternatively, the second circuit pattern 140 is formed to fill the inside of the pattern groove 145 formed in the insulating layer 130 after the insulating layer 130 is stacked.

Thus, the first circuit pattern 120 may have a substantially rectangular shape. Also, the second circuit pattern 140 may have a concavo-convex shape including the first recess R1 from which the filler 132 is removed.

In addition, the surface roughness (Ra) of the first circuit pattern 120 may be smaller than the surface roughness (Ra) of the second circuit pattern 140. That is, the second circuit pattern 140 is formed to fill the first recess R1 from which the pattern groove 145 and the filler 132 are removed, after removing the exposed filler 132 through the pattern groove 145. Accordingly, the second circuit pattern 140 may have a greater surface roughness Ra than that of the first circuit pattern 120 corresponding to the first recess R1. However, the embodiment is not limited thereto. For example, roughness is applied to the surface of the first circuit pattern 120 after the first circuit pattern 120 is formed, and a process of stacking the insulating layer 130 may be performed after the roughness is applied. Accordingly, the surface roughness Ra of the first circuit pattern 120 may correspond to the surface roughness Ra of the second circuit pattern 140.

However, at least one first recess R1 is formed around the second circuit pattern 140 in the insulating layer 130, and the second circuit pattern 140 is formed to fill the inside of the first recess R1. Unlike this, no recess is formed around the first circuit pattern 120 in the insulating layer 130.

Meanwhile, in the embodiment, a through electrode 150 may be formed in the insulating layer 130. The through electrode 150 may electrically connect the first circuit pattern 120 and the second circuit pattern 140. The through electrode 150 may be formed inside a through hole 155 (see FIG. 9) formed in the insulating layer 130.

The through hole 155 may be formed by any one of mechanical processing, laser processing, and chemical processing. When the through hole 155 is formed by mechanical processing, methods such as milling, drilling, and routing may be used, and when the through hole 155 is formed by laser processing, a UV or CO2 laser method may be used, and when formed by chemical processing, the insulating layer 130 may be opened using a chemical containing amino silane, ketones, and the like.

In addition, when the through hole 155 is formed, the through electrode 150 may be formed by filling the through hole 155 with a first metal layer and a second metal layer that are conductive materials. The first metal layer and the second metal layer may correspond to the second circuit pattern 140.

The through electrode 150 may include any one material selected from copper (Cu), silver (Ag), tin (Sn), gold (Au), nickel (Ni), and palladium (Pd). In addition, the through electrode 150 may be formed by any one or a combination of electroless plating, electrolytic plating, screen printing, sputtering, evaporation, ink-jetting and dispensing.

Meanwhile, in the process of forming the through hole 155, a portion of the filler 132 disposed in the insulating layer 130 may be exposed through the pattern groove 145. Also, when the filler 132 is exposed through the through hole 155, a size of the through hole 155 may be reduced by the exposed filler 132. Accordingly, signal transmission performance through the through electrode 150 may be affected. For example, when the filler 132 is exposed through the through hole 155, signal transmission loss of the through electrode 150 may increase due to the exposed filler 132.

Accordingly, in the embodiment, surface roughness (Ra) of a certain level or higher can be implemented even on the inner wall of the through hole 155 to correspond to the pattern groove 145.

Specifically, in the embodiment, after the through hole 155 is formed, a process of removing the filler 132 exposed through the through hole 155 may be performed. Accordingly, as the filler 132 is removed from the inner wall of the through hole 155, a second recess R2 (see FIG. 9) corresponding to a space where the filler 132 escapes may be formed.

Accordingly, the inner wall of the through hole 155 in the embodiment has a surface roughness Ra corresponding to the depth of the second recess R2. Specifically, the surface roughness Ra of the through hole 155 may also be referred to as the depth of the second recess R2. Also, the depth of the second recess R2 may mean the width of the second recess R2 in a horizontal direction.

In this case, in the embodiment, the depth of the second recess (R2) formed in the through hole 155 is in the range of 0.5 μm to 1.0 μm.

Meanwhile, the surface roughness Ra of the inner wall of the through hole 155 may be determined by the ratio of an area occupied by the second recess R2 to a total area of the inner wall of the through hole 155. In the embodiment, the second recess R2 occupies 3% to 10% of the total area of the inner wall of the through hole 155.

Meanwhile, a plurality of second recesses R2 may be formed on an inner wall of the through hole 155. In this case, the second recess R2 may correspond to the shape and diameter of the filler 132. For example, the second recess R2 may have a width corresponding to the diameter of the filler 132. For example, the filler 132 may have a diameter ranging from 0.5 μm to 1.0 μm. Also, the depth of the second recess R2 formed on the inner wall of the through hole 155 may correspond to the diameter of the filler 132. In addition, when the depth of the second recess R2 is greater than 1.0 μm, the size of the pattern groove 145 may be excessively expanded during the removal of the filler exposed through the through hole 155.

As described above, the first embodiment removes not only the pattern groove 145 but also the filler 132 exposed through the through hole 155, so that the inner wall of the through hole 155 is removed to achieve a surface roughness Ra of a certain level or higher corresponding to the second recess R2. Accordingly, it is possible to improve the bonding strength between the through electrode 150 and the insulating layer 130.

Meanwhile, both the first and second recesses R1 and R2 are filled with the first metal layer 141 in the drawings, but it is not limited thereto. Substantially, the first metal layer 141 may be formed to partially fill the first and second recesses R1 and R2. Accordingly, the remaining portions of the first and second recesses R1 and R2 may be filled with the second metal layer 142.

The circuit board 100 in the embodiment may include a first protective layer 160 and a second protective layer 170.

The first protective layer 160 is disposed on the upper surface of the insulating layer 130 and thus can protect the upper surface of the insulating layer 130 and the upper surface of the second circuit pattern 140.

In addition, the second protective layer 170 is disposed on the lower surface of the insulating layer 130 and thus can protect the lower surface of the insulating layer 130 and the lower surface of the first circuit pattern 120.

The first protective layer 160 and the second protective layer 170 may be formed of at least one layer using at least one of solder resist (SR), oxide, and Au. Preferably, the first protective layer 160 and the second protective layer 170 may be a solder resist.

The first protective layer 160 and the second protective layer 170 may function to protect upper and lower surfaces of the insulating layer 130, respectively. In addition, the first protective layer 160 and the second protective layer 170 may function to protect the upper surface of the second circuit pattern 140 and the lower surface of the first circuit pattern 120, respectively.

The first protective layer 160 may partially overlap the second circuit pattern 140. For example, the first protective layer 160 may include an opening (not shown) exposing at least a part of the upper surface of the second circuit pattern 140.

The second protective layer 170 may partially overlap the first circuit pattern 120. For example, the second protective layer 170 may include an opening (not shown) exposing at least a part of the lower surface of the first circuit pattern 120.

According to the first embodiment as described above, a pattern groove 145 is formed on at least one surface of the insulating layer 130. In addition, at least one first recess R1 is formed in the pattern groove 145. That is, the insulating layer 130 includes the filler 132, and at least a portion of the filler 132 may be exposed through the pattern groove 145. In this case, the embodiment proceeds with a process of removing the filler 132 exposed through the pattern groove 145. Accordingly, the first recess R1 corresponding to a space where the filler 132 escaped is formed on the inner wall of the pattern groove 145. Accordingly, the second circuit pattern 140 formed while filling the pattern groove 145 may be formed while filling the first recess R1 of the pattern groove 145. Therefore, the circuit board according to the embodiment can solve the reliability problem of the second circuit pattern that occurs as the filler 132 is exposed through the pattern groove 145. In addition, in the embodiment, the surface roughness (Ra) corresponding to the first recess (R1) is implemented on the inner wall of the pattern groove 145, so that it is possible to improve bonding strength between the insulating layer 130 and the second circuit pattern 140, and accordingly, product reliability can be improved.

Hereinafter, a method of manufacturing a circuit board according to the first embodiment shown in FIG. 1 will be described.

FIGS. 2 to 14 are views illustrating a manufacturing method of the circuit board shown in FIG. 1 in order of processes.

Before describing the method for manufacturing the circuit board of the embodiment, the circuit board 100 according to the embodiment may be manufactured by the ETS method using a carrier board CB. In this case, in the embodiment, a plurality of substrates may be simultaneously manufactured on both sides of the carrier board CB. However, for convenience of description, the manufacturing of the circuit board on only one side of the carrier board CB will be described below.

Referring to FIG. 2, in the embodiment, a carrier board CB may be prepared. The carrier board CB may include a carrier film CBa and a carrier copper foil layer CBb.

When the carrier board CB is prepared as described above, the embodiment may proceed with a process of forming the metal layer 110 on the carrier board CB. The metal layer 110 may be used as a seed layer of the first circuit pattern 120.

Next, referring to FIG. 3, the embodiment may proceed with a process of forming the first circuit pattern 120 on the metal layer 110. To this end, in the embodiment, a mask (not shown) having an opening may be first formed on the metal layer 110. The opening of the mask may correspond to a region of the surface of the metal layer 110 where the first circuit pattern 120 is to be formed. Next, in the embodiment, when the mask is formed, plating may be performed in the opening of the mask using the metal layer 110 as a seed layer to form the first circuit pattern 120. In addition, the mask may be removed after the first circuit pattern 120 is formed.

The first circuit pattern 120 is a wiring that transmits an electrical signal, and may be formed of a metal material having high electrical conductivity. To this end, the first circuit pattern 120 may be formed of at least one metal material selected from gold (Au), silver (Ag), platinum (Pt), titanium (Ti), tin (Sn), copper (Cu), and zinc (Zn). In addition, the first circuit pattern 120 may be formed of a paste or solder paste containing at least one metal material selected from gold (Au), silver (Ag), platinum (Pt), titanium (Ti), tin (Sn), copper (Cu), and zinc (Zn), which have excellent bonding strength. Preferably, the first circuit pattern 120 may be formed of copper (Cu), which has high electrical conductivity and is relatively inexpensive.

Next, referring to FIG. 4, in the embodiment, an insulating layer 130 covering the first circuit pattern 120 may be formed on the metal layer 110. The insulating layer 130 may include any one of RCC, ABF and PID. Preferably, the insulating layer 130 may be RCC. The RCC may include an insulating layer 130 that is a composite of resin 131 and filler 132 and a copper foil layer 133 disposed on the insulating layer 130.

Next, referring to FIG. 5, the embodiment may proceed with a process of forming a mask M1 on the copper foil layer 133. The mask M1 may be a dry film, but is not limited thereto. The mask M1 is disposed on the copper foil layer 133 and may cover an entire upper surface of the copper foil layer 133.

And, the embodiment may proceed with a process of patterning the mask M1. To this end, the embodiment may proceed with a process of forming at least one mask pattern on the mask M1 by exposing and developing the mask M1. In this case, the mask pattern may correspond to a region where the second circuit pattern 140 is to be formed.

Next, referring to FIG. 6, the embodiment may proceed with a process of patterning the copper foil layer 133. That is, in the embodiment, a process of first removing the copper foil layer 133 may be performed before forming the pattern groove 145 for forming the second circuit pattern 140.

To this end, the embodiment may proceed with a process of removing the copper foil layer 133 exposed through the mask pattern of the mask M1 by flash etching.

Next, referring to FIG. 7, the embodiment may proceed with a process of forming a pattern groove 145 on the upper surface of the insulating layer 130 exposed through the mask M1. A plurality of pattern grooves 145 may be formed on the upper surface of the insulating layer 130 to be spaced apart from each other. The width of the pattern groove 145 may correspond to a line width of a fine circuit pattern. In addition, an interval between the plurality of pattern grooves 145 may correspond to a pitch of the fine circuit pattern. The pattern groove 145 may not pass through the insulating layer 130. For example, the pattern groove 145 may be formed by processing a part of the upper surface of the insulating layer 130. Accordingly, the depth of the pattern groove 145 may be smaller than the thickness of the insulating layer 130. The pattern groove 145 may be formed by plasma etching an upper surface of the insulating layer 130 exposed through the mask M1.

Next, referring to FIG. 8, the embodiment may proceed with a process of forming a through hole 155 in the insulating layer 130. The through hole 155 may be formed by laser processing. Accordingly, the through hole 155 may have a trapezoidal shape in which the width changes from one side to the other side. In this case, the through hole 155 may overlap in a vertical direction with at least one of the plurality of pattern grooves 145. In other words, the through hole 155 may be connected to at least one pattern groove 145 among the plurality of pattern grooves 145. In this case, the pattern groove 145 does not pass through the insulating layer 130. Accordingly, the through hole 155 may be formed to pass through the insulating layer 130 while being connected to a specific pattern groove. The through hole 155 may expose an upper surface of at least one circuit pattern among the first circuit patterns 120.

Meanwhile, in the process of forming the pattern groove 145 and the through hole 155 as described above, the filler 132 in the insulating layer 130 may be exposed through the pattern groove 145 and the through hole 155. In this case, the filler 132 may be a silica filler made of any one ceramic material selected from among $SiO_2$, $ZrO_3$, $HfO_2$, and $TiO_2$. Accordingly, in the process of forming the pattern groove 145 and the through hole 155, the filler 132 made of the above material may be exposed to their insides through the pattern groove 145 and the through hole 155.

Next, referring to FIG. 9, the embodiment may proceed with a process of removing the filler 132 exposed through the pattern groove 145 and the through hole 155. A process of removing the filler 132 may be performed using a glass etching solution. For example, after the pattern groove 145 and the through hole 155 are formed, the embodiment may remove the filler 132 exposed through the pattern groove 145 and the through hole 155 using HF, a glass etching solution. Accordingly, a recess may be formed in the inner wall of the pattern groove 145 and the through hole 155 to correspond to a position where the filler 132 is removed.

For example, at least one first recess R1 corresponding to a position from which the filler 132 is removed may be formed in the pattern groove 145. In addition, at least one second recess R2 may be formed in the through hole 155 to correspond to a position where the filler 132 is removed.

In this case, the inner wall of the pattern groove 145 may have a surface roughness Ra corresponding to the depth of the first recess R1. In addition, the inner wall of the through hole 155 may have a surface roughness Ra corresponding to the depth of the second recess R2. For example, the depth of the first recess R1 of the inner wall of the pattern groove 145 may have a range of 0.5 μm to 1.0 μm. Accordingly, the surface roughness (Ra) of the inner wall of the pattern groove 145 may have a range of 0.5 μm to 1.0 μm.

In addition, an inner wall of the through hole 155 may have a surface roughness Ra corresponding to the depth of the second recess R2. In this case, the depth of the second recess R2 may have a range of 0.5 μm to 1.0 μm. Accordingly, the surface roughness (Ra) of the inner wall of the through hole 155 may have a range of 0.5 μm to 1.0 μm.

Meanwhile, the first recess R1 and the second recess R2 may have a depth corresponding to the diameter of the filler 132 constituting the insulating layer 130. For example, the diameter of the filler 132 may have a range of 0.5 μm to 1.0 μm. Also, the depth of the first recess R1 formed on the inner wall of the pattern groove 145 may be 0.5 μm to 1.0 μm corresponding to the diameter of the filler 132. In this case, when the depth of the first recess R1 is greater than 1.0 μm, the size of the pattern groove 145 may be expanded during the removal of the filler exposed through the pattern groove 145. In this case, miniaturization of the second circuit pattern 140 may be difficult. Accordingly, the filler 132 may have a diameter ranging from 0.5 μm to 1.0 μm, and the first recess R1 may have a depth corresponding to the diameter of the filler 132. In addition, the depth of the second recess R2 formed on the inner wall of the through hole 155 may be 0.5 μm to 1.0 μm corresponding to the diameter of the filler 132. When the depth of the second recess R2 is greater than 1.0 μm, the size of the through hole 155 may be excessively expanded, resulting in a reliability problem. Therefore, in the embodiment, the second recess R2 has a range of 0.5 μm to 1.0 μm corresponding to the diameter of the filler 132.

Next, referring to FIG. 10, in the embodiment, a first metal layer 141 is formed on the inner wall of the pattern groove 145 and the inner wall of the through hole 155. The first metal layer 141 may be formed on the upper surface of the copper foil layer 133, the inner wall of the pattern groove 145, and the inner wall of the through hole 155 through chemical copper plating. In this case, the first metal layer 141 may include a convex portion (not shown). That is, the first metal layer 141 may be formed while filling the first recess R1 of the pattern groove 145 and the second recess R2 of the through hole 155. Accordingly, a portion of the first metal layer 141 corresponding to the first recess R1 of the pattern groove 145 may be convex. In addition, a portion of the first metal layer 141 corresponding to the second recess R2 of the through hole 155 may be convex.

Next, referring to FIG. 11, the embodiment may proceed with a process of forming the second metal layer 142 filling the inside of the pattern groove 145 and the inside of the through hole 155 by electroplating the first metal layer 141 as a seed layer. The second metal layer 142 may protrude from the copper foil layer 133 with a predetermined height.

Next, referring to FIG. 12, the embodiment may proceed with a process of polishing and planarizing the first metal layer 141 and the second metal layer 142. For example, the embodiment may proceed with a process of polishing and removing metal layers positioned higher than the upper surface of the insulating layer 130. In this case, the polished metal layers may include the first metal layer 141, the second metal layer 142, and the copper foil layer 133. Accordingly, in the embodiment, the upper surface of the second circuit pattern 140 including the first metal layer 141 and the second metal layer 142 may be positioned on the same plane as the upper surface of the insulating layer 130.

Next, referring to FIG. 13, the embodiment may proceed with a process of removing the carrier board CB disposed under the insulating layer 130. The carrier board CB may be removed when all processes of laminating the insulating layers constituting the circuit board 100 are completed. In this case, a plurality of circuit boards may be simultaneously manufactured on the upper and lower portions of the carrier board CB, respectively. Also, the process of removing the carrier board CB may be a process of separating the plurality of circuit boards from each other.

Next, referring to FIG. 14, the embodiment may proceed with a process of removing the metal layer 110 disposed on the lower surface of the insulating layer 130. The metal layer 110 is a layer used as a seed layer of the first circuit pattern 120. In addition, the metal layer 110 may be removed after final manufacturing of the circuit board 100 is completed. Accordingly, unlike the second circuit pattern 140, the first circuit pattern 120 has a structure in which a seed layer is not disposed on a side surface thereof.

In addition, the embodiment may proceed with a process of forming a first protective layer 160 on an upper surface of the insulating layer 130 and forming a second protective layer 170 on a lower surface of the insulating layer 130.

The first protective layer 160 and the second protective layer 170 may be formed of at least one layer using at least one of solder resist (SR), oxide, and Au. Preferably, the first protective layer 160 and the second protective layer 170 may be a solder resist.

The first protective layer 160 and the second protective layer 170 may function to protect upper and lower surfaces of the insulating layer 130, respectively. In addition, the first protective layer 160 and the second protective layer 170 may function to protect the upper surface of the second circuit pattern 140 and the lower surface of the first circuit pattern 120, respectively.

The first protective layer 160 may partially overlap the second circuit pattern 140. For example, the first protective layer 160 may include an opening (not shown) exposing at least a part of the upper surface of the second circuit pattern 140.

The second protective layer 170 may partially overlap the first circuit pattern 120. For example, the second protective layer 170 may include an opening (not shown) exposing at least a part of the lower surface of the first circuit pattern 120.

According to the first embodiment as described above, a pattern groove 145 is formed on at least one surface of the insulating layer 130. In addition, at least one first recess R1 is formed in the pattern groove 145. That is, the insulating layer 130 includes the filler 132, and at least a portion of the filler 132 may be exposed through the pattern groove 145. In this case, the embodiment proceeds with a process of removing the filler 132 exposed through the pattern groove 145. Accordingly, the first recess R1 corresponding to a space where the filler 132 escaped is formed on the inner wall of the pattern groove 145. Accordingly, the second circuit pattern 140 formed while filling the pattern groove 145 may be formed while filling the first recess R1 of the pattern groove 145. Therefore, the circuit board according to the embodiment can solve the reliability problem of the second circuit pattern that occurs as the filler 132 is exposed through the pattern groove 145. In addition, in the embodiment, the surface roughness (Ra) corresponding to the first recess (R1) is implemented on the inner wall of the pattern groove 145, so that it is possible to improve bonding strength between the insulating layer 130 and the second circuit pattern 140, and accordingly, product reliability can be improved.

FIG. 15 is a view illustrating a circuit board according to a second embodiment.

Referring to FIG. 15, the circuit board 200 may have a multi-layer structure based on an insulating layer. That is, the circuit board 100 in the first embodiment has a one-layer structure in the insulating layer 130, but the circuit board 200 in the second embodiment may have a two or more layer structure in the insulating layer.

In the embodiment, the multi-layered circuit board 200 may be manufactured by the ETS method.

In this case, the circuit board 100 in FIG. 1 may represent an insulating layer region disposed on an uppermost part of the circuit board 200 having a multi-layer structure.

Accordingly, the circuit board 200 in the second embodiment may include a first insulating layer 230, a first circuit pattern 220, a second circuit pattern 240, a through electrode 250, and a first protective layer 260. This may correspond to the circuit board 100 described in FIG. 1, and detailed description thereof will be omitted.

A second insulating layer 280 may be disposed on a lower surface of the first insulating layer 230. In addition, a third circuit pattern 285 may be buried in the lower surface of the second insulating layer 280.

In addition, a third insulating layer 290 may be disposed on a lower surface of the second insulating layer 280. In addition, a fourth circuit pattern 295 may be buried in the lower surface of the third insulating layer 290.

In addition, a second protective layer 270 may be disposed on a lower surface of the third insulating layer 290.

The first insulating layer 230 and the third insulating layer 290 may include the same insulating material or insulating material. That is, the third insulating layer 290 may be any one of RCC, ABF, and PID identical to that of the first insulating layer 230.

The second insulating layer 280 may include an insulating material or an insulating material different from those of the first insulating layer 230 and the third insulating layer 290. For example, the second insulating layer 280 may include prepreg.

The circuit board 200 in the second embodiment as described above may be a coreless board having a multilayer structure. In this case, the second circuit pattern 240 disposed on an outermost side of the circuit board 200 may have the same structure as the second circuit pattern 140 described in FIG. 1.

FIG. 16 is a view illustrating a circuit board according to a third embodiment.

Referring to FIG. 16, the circuit board 300 according to the third embodiment may have a multilayer structure and may be a core board including a core layer.

Accordingly, the circuit board 300 may include a core layer 310. The core layer 310 may be CCL (Copper Clad Laminate), but is not limited thereto.

Substrate layers are respectively disposed above and below the core layer 310. For example, a first substrate layer 100A may be disposed on the core layer 310. For example, a second substrate layer 100B may be disposed below the core layer 310.

The first substrate layer 100A and the second substrate layer 100B may have a mutually symmetrical structure with respect to the core layer 310.

In this case, each of the first substrate layer 100A and the second substrate layer 100B may include an insulating layer 130, a first circuit pattern 120, a second circuit pattern 140, and a through electrode 150.

That is, in the case of the circuit board 300 including the core layer 310, a process of laminating insulating layers may be performed on both sides of the core layer 310. In addition, after the insulating layer is laminated and the pattern groove described in FIG. 1 is formed on the surface of the insulating layer, a process of forming the second circuit pattern 140 filling the pattern groove may be performed. Therefore, in an embodiment, a core substrate including a core layer may be provided as a circuit board including double-sided embedded circuit patterns.

FIG. 17 is a view illustrating a circuit board according to a fourth embodiment.

Referring to FIG. 17, the circuit board 400 includes an insulating layer 430, a first circuit pattern 420, a second circuit pattern 440, a through electrode 450, a first protective layer 460, and a second protective layer 470.

In this case, before describing the circuit board of the fourth embodiment, a detailed description of the same configuration as that of the circuit board shown in FIG. 1 will be omitted. In the first embodiment, the filler 132 exposed through the pattern groove 145 and the through hole 155 was removed to form a first recess R1 and a second recess R2 corresponding to the filler 132. In addition, in the first embodiment, the inner wall of the pattern groove 145 and the inner wall of the through hole 155 have surface roughness corresponding to the respective depths of the first recess R1 and the second recess R2 (Ra).

Unlike this, in the circuit board 400 according to the fourth embodiment, a process of cutting out the filler 432 exposed through the pattern groove and the through hole by plasma treatment may be performed without completely removing the filler 432. Accordingly, the inner wall of the pattern groove 145 and the inner wall of the through hole 155 in the first embodiment are made of only the resin 131 of the insulating layer 130. Unlike this, in the fourth embodiment, as the plasma treatment is performed without completely removing the filler 432, the inner wall of the pattern groove and the inner wall of the through hole include a first portion formed of resin 431 and a second portion formed of filler 432. In addition, in the fourth embodiment, the surface roughness Ra of the first portion formed of the resin 431 and the second portion formed of the filler 432 is set to be 0.5 μm to 1.0 μm, respectively.

That is, in the embodiment, a pattern groove is formed on the surface of the insulating layer 430, and the second circuit pattern 440 is formed by filling the formed pattern groove. In this case, when the filler 432 is exposed through the pattern groove 445, a problem may occur in the reliability of the second circuit pattern 440 by the filler 432. Therefore, in the embodiment, a part of the filler 432 protruding through the inner wall of the pattern groove 445 can be removed. That is, in the embodiment, the surface roughness Ra of a certain level or higher is implemented on the inner wall of the pattern groove by removing a part of the filler 432 exposed through the inner wall of the pattern groove 445.

Specifically, in the embodiment, after the pattern groove is formed, a plasma treatment process may be performed on the resin 431 and the filler 432 exposed through the pattern groove. Therefore, as the resin 431 and the filler 432 are cut on the inner wall of the pattern groove, a surface roughness Ra corresponding thereto may be formed on the inner wall of the pattern groove.

That is, in the first embodiment, the inner wall of the pattern groove 145 and the inner wall of the through hole 155 have the surface roughness Ra corresponding to the depths of the first and second recesses R1 and R2.

Unlike this, in the fourth embodiment, the inner wall of the pattern groove and the inner wall of the through hole are plasma treated to form a surface roughness (Ra) in the range of 0.5 μm to 1.0 μm corresponding to the plasma treatment.

Accordingly, the inner wall of the pattern groove 145 and the inner wall of the through hole 155 in the first embodiment are made of only resin.

Unlike this, the inner wall of the pattern groove and the inner wall of the through hole in the fourth embodiment include a first portion made of resin and a second portion made of filler, and the surface roughness (Ra) of these combinations may have a range of 0.5 μm to 1.0 μm.

The circuit board 400 in the embodiment may include a first protective layer 460 and a second protective layer 470.

The first protective layer 460 is disposed on the upper surface of the insulating layer 430 and thereby protecting the upper surface of the insulating layer 430 and the upper surface of the second circuit pattern 440.

In addition, the second protective layer 470 is disposed on the lower surface of the insulating layer 430, thereby protecting the lower surface of the insulating layer 430 and the lower surface of the first circuit pattern 420.

The first protective layer 460 and the second protective layer 470 may be formed of at least one layer using at least one of solder resist (SR), oxide, and Au. Preferably, the first protective layer 460 and the second protective layer 470 may be a solder resist.

The first protective layer 460 and the second protective layer 470 may function to protect upper and lower surfaces of the insulating layer 430, respectively. In addition, the first protective layer 460 and the second protective layer 470 may function to protect the upper surface of the second circuit pattern 440 and the lower surface of the first circuit pattern 420, respectively.

The circuit board of the embodiment may have a structure in which all circuit patterns of an outermost layer disposed on both sides of an insulating layer are all buried in the insulating layer. According to this, as the embodiment has a structure in which all of the circuit patterns are buried in the insulating layer, it is possible to reduce a thickness of the printed circuit board by a thickness of the circuit pattern, thereby achieving a slimmer product.

In addition, when only one circuit pattern of both sides of the circuit board is buried in the insulating layer, there is a problem in that warpage occurs due to an asymmetric structure during the manufacturing process of the circuit board. On the other hand, in the embodiment, the occurrence of warpage of the circuit board can be minimized by embedding the circuit patterns on both sides of the circuit board in the insulating layer, and thus product reliability can be improved.

In addition, a pattern groove is formed on at least one surface of the insulating layer of the embodiment. And, at least one first recess is formed in the pattern groove. That is, the insulating layer may include a filler, and at least a portion of the filler may be exposed through the pattern groove. In this case, the embodiment proceeds with a process of removing the filler exposed through the pattern groove. Accordingly, the first recess corresponding to a position where the filler escapes is formed on an inner wall of the pattern groove. Accordingly, the second circuit pattern formed while filling the pattern groove may be formed while filling the first recess of the pattern groove. Accordingly, the circuit board according to the embodiment can solve the reliability problem of the second circuit pattern caused by exposure of the filler through the pattern groove. In addition, the embodiment may improve bonding strength between the insulating layer and the second circuit pattern by implementing a surface roughness (Ra) corresponding to the first recess on the inner wall of the pattern groove, and accordingly, product reliability can be improved.

On the other hand, when the circuit board having the above-described characteristics of the invention is used in an IT device or home appliance such as a smart phone, a server computer, a TV, and the like, functions such as signal transmission or power supply can be stably performed. For example, when the circuit board having the features of the present invention performs a semiconductor package function, it can function to safely protect the semiconductor chip from external moisture or contaminants, or alternatively, it is possible to solve problems of leakage current, electrical short circuit between terminals, and electrical opening of terminals supplied to the semiconductor chip. In addition, when the function of signal transmission is in charge, it is possible to solve the noise problem. Through this, the circuit board having the above-described characteristics of the invention can maintain the stable function of the IT device or home appliance, so that the entire product and the circuit board to which the present invention is applied can achieve functional unity or technical interlocking with each other.

When the circuit board having the characteristics of the invention described above is used in a transport device such as a vehicle, it is possible to solve the problem of distortion of a signal transmitted to the transport device, or alternatively, the safety of the transport device can be further improved by safely protecting the semiconductor chip that controls the transport device from the outside and solving the problem of leakage current or electrical short between terminals or the electrical opening of the terminal supplied to the semiconductor chip. Accordingly, the transportation device and the circuit board to which the present invention is applied can achieve functional integrity or technical interlocking with each other. Furthermore, when the circuit board having the above-described characteristics of the invention is used in a transportation device such as a vehicle, it is possible to transmit a high-current signal required by the vehicle at a high speed, thereby improving the safety of the transportation device. Furthermore, the circuit board and the semiconductor package including the same can be operated normally even in an unexpected situation occurring in various driving environments of the transportation device, thereby safely protecting the driver.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

The invention claimed is:

1. A circuit board comprising:

an insulating layer; and an electrode part disposed in the insulating layer, wherein the insulating layer includes:

a plurality of first grooves provided on an upper surface of the insulating layer and spaced apart in a horizontal direction; and a through hole overlapping at least one of the plurality of first grooves in a vertical direction, wherein the electrode part includes:

a first circuit pattern disposed in the plurality of first grooves; and a through electrode disposed in the through hole, wherein the insulating layer includes a resin and a plurality of fillers disposed in the resin, wherein the plurality of fillers include a plurality of embedded fillers embedded in the resin, and a plurality of first exposed fillers exposed through the through hole and in contact with the through electrode, wherein an inner wall of the through hole of the insulating layer includes a first portion formed of the resin and etched by plasma treatment, and a second portion formed of the plurality of first exposed fillers and etched by the plasma treatment together with the first portion, wherein the through electrode is in contact with the first portion and the second portion, and wherein the first portion and the second portion have a surface roughness in a range of 0.5 μm to 1.0 μm.

2. The circuit board of claim 1, wherein the first portion and the second portion have a serrated shape.

3. The circuit board of claim 1, wherein the plurality of fillers include a plurality of second exposed fillers exposed through the plurality of first grooves and in contact with the first circuit pattern, wherein an inner wall of the first grooves of the insulating layer includes a third portion formed of the resin and etched by plasma treatment, and a fourth portion formed of the plurality of second exposed fillers and etched by the plasma treatment together with the third portion, wherein the first circuit pattern is in contact with the third portion and the fourth portion, and wherein the third portion and the fourth portion have a surface roughness in a range of 0.5 μm to 1.0 μm.

4. The circuit board of claim 3, wherein the third portion and the fourth portion have a serrated shape.

5. The circuit board of claim 3, wherein the first circuit pattern includes a first metal layer disposed on the inner wall of the first grooves and in contact with the third portion and the fourth portion, and a second metal layer disposed on the first metal layer.

6. The circuit board of claim 1, wherein the through electrode includes a first metal layer disposed on the inner wall of the through hole and in contact with the first portion and the second portion, and a second metal layer disposed on the first metal layer.

7. The circuit board of claim 1, wherein the insulating layer further includes a plurality of second grooves provided on a lower surface of the insulating layer and spaced apart from each other in a horizontal direction, and wherein the electrode part further comprises a second circuit pattern disposed in the second grooves.

8. The circuit board of claim 7, wherein the through hole overlaps at least one of the plurality of second grooves in a vertical direction, wherein the through electrode is connected to the second circuit pattern, and wherein the above plurality of fillers are not exposed through the plurality of second grooves.

9. The circuit board of claim 1, further comprising:

a protective layer disposed on the insulating layer and the first circuit pattern.

10. The circuit board of claim 9, wherein the protective layer has an opening, and wherein the opening partially overlaps the first circuit pattern and the through electrode in the vertical direction.

* * * * *